US006653904B2

(12) United States Patent
Franca-Neto

(10) Patent No.: US 6,653,904 B2
(45) Date of Patent: Nov. 25, 2003

(54) ELECTRICALLY TUNED INTEGRATED AMPLIFIER FOR WIRELESS COMMUNICATIONS

(75) Inventor: Luiz M. Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/277,015

(22) Filed: Oct. 21, 2002

(65) Prior Publication Data

US 2003/0030495 A1 Feb. 13, 2003

Related U.S. Application Data

(62) Division of application No. 09/711,332, filed on Nov. 9, 2000.

(51) Int. Cl.[7] .................................................. H03F 3/04

(52) U.S. Cl. ........................................ 330/302; 330/305

(58) Field of Search ................................ 330/283, 302, 330/305, 310, 311, 303, 306; 327/332

(56) References Cited

U.S. PATENT DOCUMENTS 4,409,557 A 10/1983 Sechi ......................... 330/277
5,463,362 A 10/1995 Kitaguchi .................... 334/47
5,469,117 A 11/1995 Philippe ..................... 331/109

*Primary Examiner*—Henry Choe
(74) *Attorney, Agent, or Firm*—Schwegman, Lundberg, Woessner & Kluth, P.A.

(57) ABSTRACT

An electrically tunable radio frequency (RF) amplifier includes a resonant circuit having a voltage variable capacitance as one of its elements. In one approach, a drain diffusion capacitance of one of the transistors within the amplifier is used as the voltage variable capacitance. A voltage adjustment unit is provided to adjust a bias voltage on the voltage variable capacitance to change the capacitance value thereof and thus modify the operating frequency range of the amplifier. In one embodiment, the voltage adjustment unit also provides a power supply noise blocking function.

25 Claims, 5 Drawing Sheets

ELECTRICALLY TUNED INTEGRATED AMPLIFIER FOR WIRELESS COMMUNICATIONS

This application is a divisional of U.S. application Ser. No. 09/711,332 filed Nov. 9, 2000.

FIELD OF THE INVENTION

The invention relates generally to radio frequency amplifiers and, more particularly, to integrated radio frequency amplifiers.

BACKGROUND OF THE INVENTION

Radio frequency (RF) circuits that are integrated onto a semiconductor chip for use in wireless communications are becoming increasingly popular. RF circuits typically include one or more resonant circuit portions that limit operation of the RF circuit to a frequency range of interest. Because of variations in the circuit fabrication process, however, the resonant frequency of RF circuits often needs to be tuned after circuit fabrication to achieve the desired frequency range. For non-integrated RF circuits, this tuning procedure is often done manually by physically adjusting the device structures. Such physical tuning is time consuming and labor intensive and adds significantly to the overall manufacturing cost of RF circuits. For integrated RF circuits, it is not normally desirable and sometimes even impossible to perform similar physical adjustments.

Therefore, there is a need for a method and apparatus for tuning integrated RF circuits.

DETAILED DESCRIPTION

Figure 1:
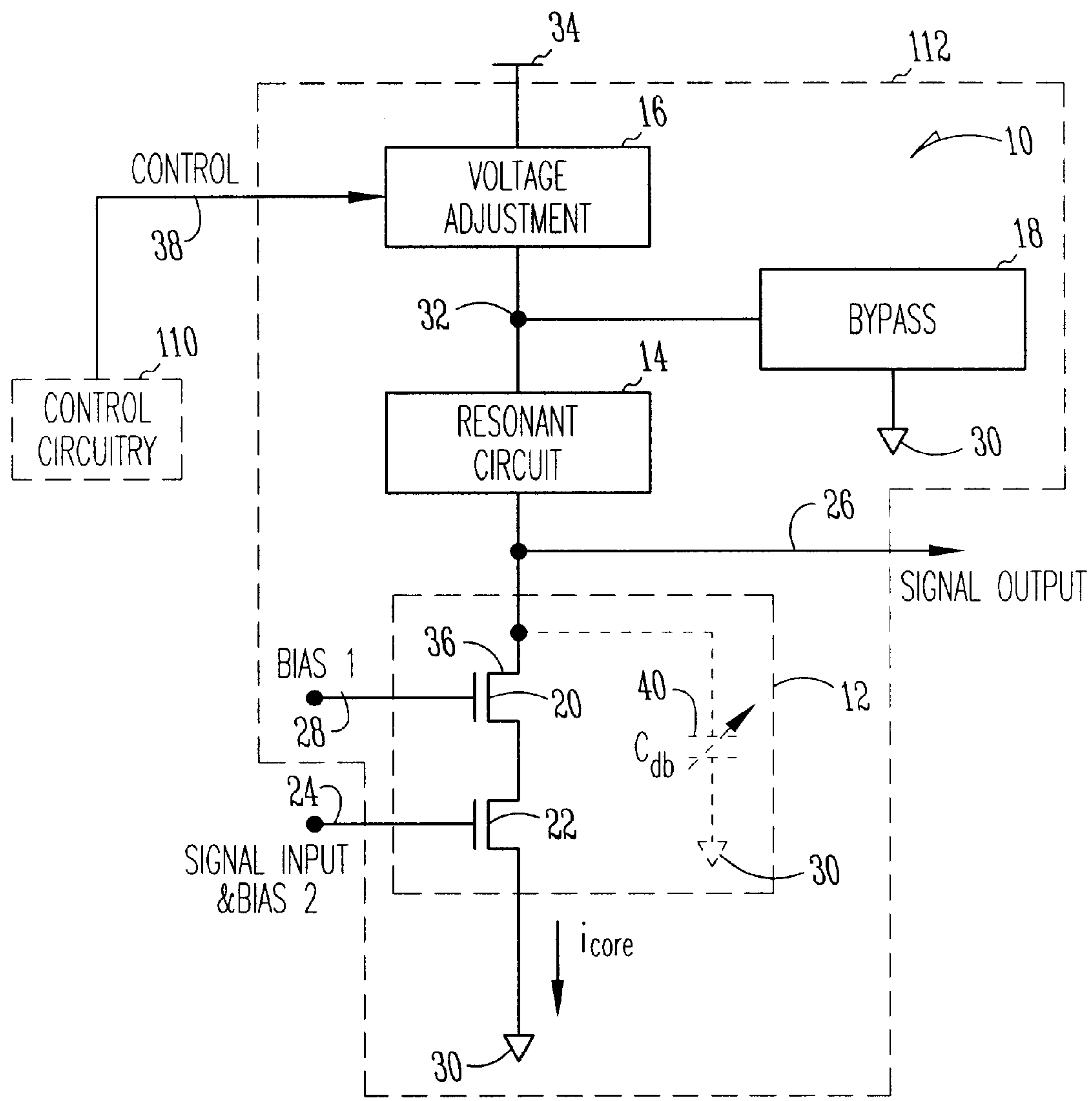
FIG. 1 is a schematic diagram illustrating a single-ended, cascode-based, low noise amplifier (LNA) circuit in accordance with one embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to an integrated radio frequency (RF) amplifier for use in wireless applications. The amplifier uses a voltage variable capacitance (preferably within one of the transistors of the amplifier) as a tuning element to adjust the resonant frequency of a resonant circuit (e.g., a tank circuit) within the amplifier. A voltage adjustment device is provided for changing a bias voltage on the voltage variable capacitance during tuning operations. In one approach, the tuning functionality is used during a manufacture/test procedure to tune the operational frequency of individual production amplifiers. In another approach, the tuning functionality is used during amplifier operation to change the amplifier between individual operational frequency bands. The principles of the present invention can be used to tune the frequency of a wide range of different RF amplifier types. Frequency tuning on the order of 10–30% of the original center frequency has been achieved using the inventive principles.

FIG. 1 is a simplified schematic diagram illustrating a single-ended, cascode-based, low noise amplifier (LNA) circuit 10 in accordance with one embodiment of the present invention. The LNA circuit 10 can be implemented, for example, at the output of an RF receive antenna to amplify a received signal in a low noise manner before it is delivered to receive circuitry for additional processing. The LNA circuit 10 includes a signal input terminal 24 for receiving an RF input signal from a signal source (e.g., an antenna) and a signal output terminal 26 for delivering an amplified version of the RF input signal to other circuitry (e.g., a receiver). The LNA circuit 10 also includes: a cascode core 12, a resonant circuit 14, a voltage adjustment unit 16, and a bypass device 18. The cascode core 12 includes first and second insulated-gate field effect transistors (IGFETs) 20, 22 connected in a conventional cascode configuration. The first transistor 20 includes a gate terminal 28 that receives a first bias voltage (i.e., BIAS 1) during amplifier operation. The first transistor 20 also includes a drain terminal 36 that is coupled to the signal output terminal 26 of the LNA circuit 10. The second transistor 22 includes a drain terminal that is connected to a source terminal of the first transistor 20. The second transistor 22 also includes a gate terminal that receives a second bias voltage (i.e., BIAS 2) during amplifier operation. As illustrated, the gate terminal of the second transistor 22 also serves as the signal input terminal 24 of the LNA circuit 10. The source terminal of the second transistor 22 is coupled to ground 30 either directly (as illustrated in FIG. 1) or through an inductor. The resonant circuit 14 is coupled at one end to the output terminal 26 and at the other end to a circuit node 32. The voltage adjustment unit 16 is connected between the circuit node 32 and a supply terminal 34. The bypass unit 18 is connected between the circuit node 32 and ground 30.

During normal operation, the first and second transistors 20, 22 are biased into saturation to generate a fixed bias current $i_{core}$ through the cascode core 12. The RF input signal at the gate of the second transistor 22 then modulates this bias current 12 in a relatively linear fashion to generate an amplified output signal at the signal output terminal 26. The resonant circuit 14 is a tuned circuit (e.g., a tank circuit) that acts as a bandpass filter on the LNA's output terminal 26 to pass signal components that are within a desired operational frequency range and attenuate signal components outside this range. The bypass unit 18 provides a low impedance path to ground 30 from the circuit node 32 for RF currents, while blocking DC current flow to ground 30. The resonant circuit 14 thus appears as a shunt impedance to ground 30 to RF currents in the output circuit.

As illustrated in FIG. 1, the first transistor 20 has a voltage variable diffusion capacitance ($C_{db}$) 40 at its drain terminal 36. This capacitance appears between the output terminal 26 and ground 30 in the LNA circuit 10. The diffusion capacitance $C_{db}$ is formed by the p-n junction drain diffusion of transistor 20 and the substrate. In some applications this capacitance is considered "parasitic." In accordance with the present invention, however, this capacitance is used as a component of the resonant circuit 14. That is, the diffusion capacitance $C_{db}$ at the drain terminal 36 of the first transistor 20 is used as a tuning element to adjust the resonant frequency of the resonant circuit 14 and thus the operational frequency range of the LNA circuit 10. The voltage adjustment unit 16 is operative for varying the DC bias voltage value on the circuit node 32 in response to a control signal at control input port 38. This voltage adjustment translates through the resonant circuit 14 to the drain terminal 36 of the first transistor 20, thus changing the voltage controllable diffusion capacitance $C_{db}$ therein. As long as the voltage on the drain terminal 36 is kept above a particular value, the first and second transistors 20, 22 remain in saturation and the bias voltage change should have little or no effect on the basic operation of the cascode core 12.

The voltage adjustment unit 16 can include any circuitry that is capable of varying a voltage across a voltage variable capacitance. In the illustrated embodiment, the voltage adjustment unit 16 does this by generating a controlled voltage drop between the supply terminal 34 and the circuit node 32 under constant current conditions. The control signal applied to the control input 38 of the voltage adjustment unit 16 can be either analog or digital. The bypass unit 18 will normally include a capacitor structure having a capacitance value that has a relatively low reactance at the amplifier operating frequency. The resonant circuit 14 can include any of a number of different resonating circuit structures. The location of the resonant circuit 14 within the amplifier 10 will normally depend upon the specific circuit structure being implemented.

In one embodiment of the invention, the LNA circuit 10 of FIG. 1 includes control circuitry 110 coupled to the input 38 of the voltage adjustment unit 16 to generate the control signal during amplifier operation. The control circuitry 110 can include, for example, functionality for tuning the frequency of operation of the LNA circuit 10 in the field. In one implementation, the control circuitry 110 includes functionality to tune the LNA circuit 10 to compensate for the effects of component aging within the circuit 10. This functionality can be programmed to perform this tuning automatically (e.g., at predetermined time intervals) or in response to a user request.

With reference to FIG. 1, in one implementation, the resonant circuit 14, the voltage adjustment unit 16, the bypass device 18, and the first and second transistors 20, 22 are all integrated onto a single semiconductor chip. These elements are thus implemented in a form that is integration friendly. The semiconductor chip is mounted within an integrated circuit (IC) package 112 having a plurality of input/output pins. In one approach, at least one pin is provided for each of the following: the signal input terminal 24, the signal output terminal 26, the control port 38, the supply terminal 34, and the ground terminal 30. To use the package mounted LNA circuit 10, the IC package is installed into an external circuit such as a receiver circuit or the like.

Figure 2:
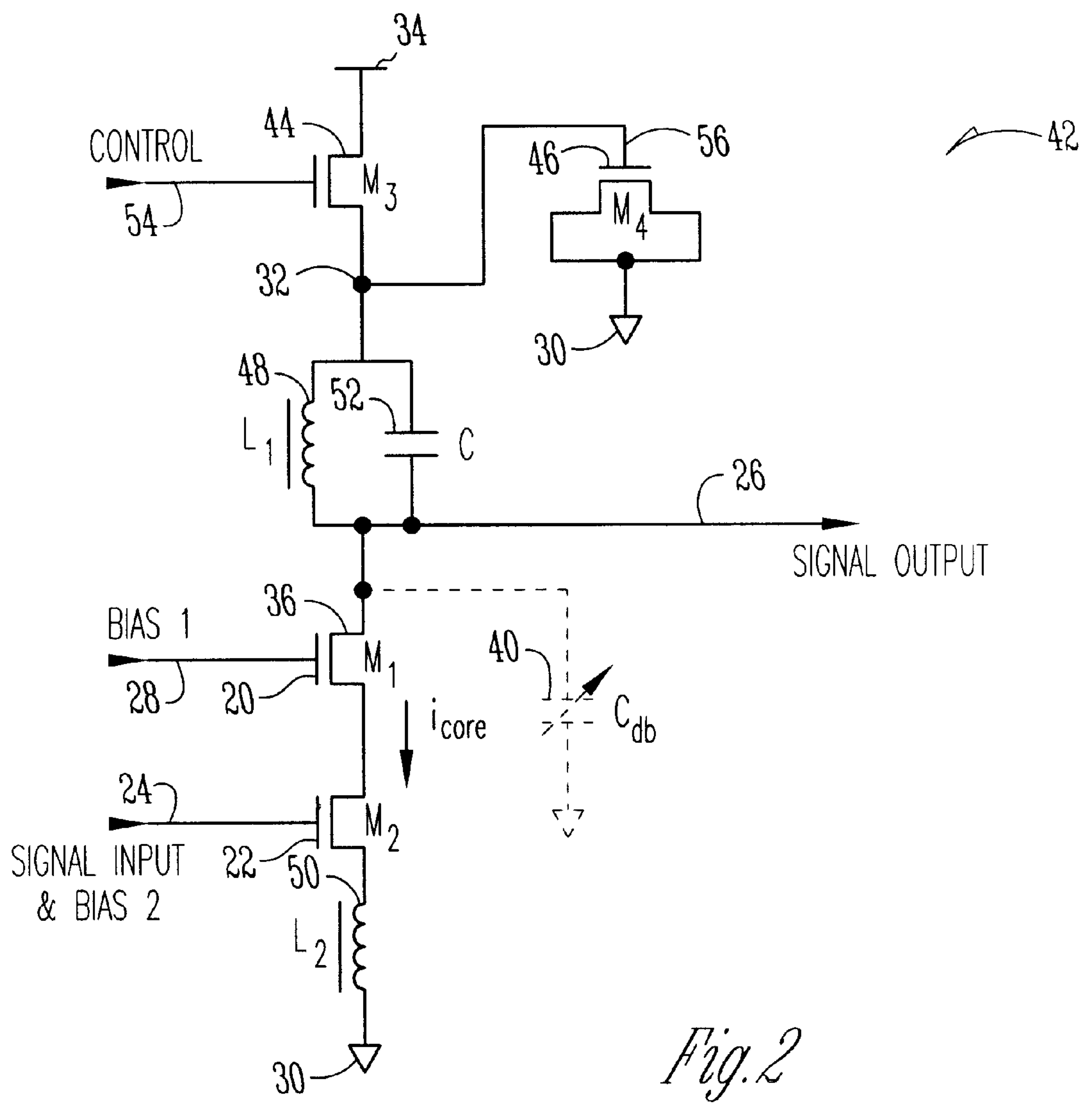
FIG. 2 is a schematic diagram illustrating a single-ended, cascode-based, LNA circuit in accordance with another embodiment of the present invention.

FIG. 2 is a schematic diagram illustrating a single-ended, cascode-based, LNA circuit 42 that is one possible implementation of the LNA circuit 10 of FIG. 1. The LNA circuit 42 includes: first, second, third and fourth transistors 20, 22, 44, 46 (M1, M2, M3, and M4, respectively); first and second inductors 48, 50 (L1 and L2, respectively); a capacitor 52; a signal input terminal 24; a signal output terminal 26; and a control terminal 54. As before, the first and second transistors 20, 22 are arranged in a conventional cascode configuration. The second inductor 50 is connected between the source of the second transistor 22 and ground 30. The first transistor 20 has a voltage variable diffusion capacitance 40. The first inductor 48 and the capacitor 52 are connected in parallel to form, along with the diffusion capacitance 40, a resonant tank circuit. The fourth transistor 46 has a gate terminal 56 that is connected to the circuit node 32. The drain and source terminals of the fourth transistor 46 are connected together and coupled to ground 30. The fourth transistor 46 thus operates as a capacitor for bypassing RF currents to ground 30. The third transistor 44 has a drain terminal connected to the supply 34 and a source terminal connected to circuit node 32. The third transistor 44 also includes a gate terminal that serves as the control terminal 54.

As discussed above, the first and second transistors 20, 22 are in saturation during normal amplifier operation. Thus, the DC bias current $i_{core}$ through the cascode is set by the bias voltages on the gate terminals of the first and second transistors 20, 22 (i.e., BIAS 1 and BIAS 2) and is not significantly affected by the voltage on the drain 36 of the first transistor 20. Consequently, the bias current through the output portion of the third transistor 44 will be relatively constant. Because the third transistor 44 will also be in saturation, when the voltage on the control terminal 54 is varied, the voltage at node 32 will change to keep the gate to source voltage drop constant for the third transistor 44. Therefore, the drain to source voltage drop across the third transistor 44 will vary in direct proportion to the changing voltage on the control terminal 54. The bias voltage on the circuit node 32 is equal to the difference between the supply voltage on supply node 34 and the drain to source voltage drop of the third transistor 44. Because the first inductor 48 appears as a short circuit to DC, the bias voltage on the source 36 of the first transistor 20 will be substantially the same as the voltage on circuit node 32. As discussed above, the bias voltage variation on the drain terminal 36 of the first transistor 20 changes the voltage variable diffusion capacitance therein and, therefore, changes the frequency of operation of the LNA circuit 42. Thus, the LNA circuit 42 can be tuned by varying the control voltage on the control terminal 54. Significantly, the third transistor 44 will also act as a noise blocking device to block power supply noise coming from the supply terminal 34. This is because the drain terminal of the third transistor 44 will block voltage noise from terminal 34 which prevents the generation of noise current in the resonant circuit. In the illustrated embodiment, the third transistor 44 is an n-channel metal oxide semiconductor (NMOS) device. It should be appreciated that other transistor types (such as, for example, p-channel metal oxide semiconductor (PMOS) devices) can also be used.

Figure 3:
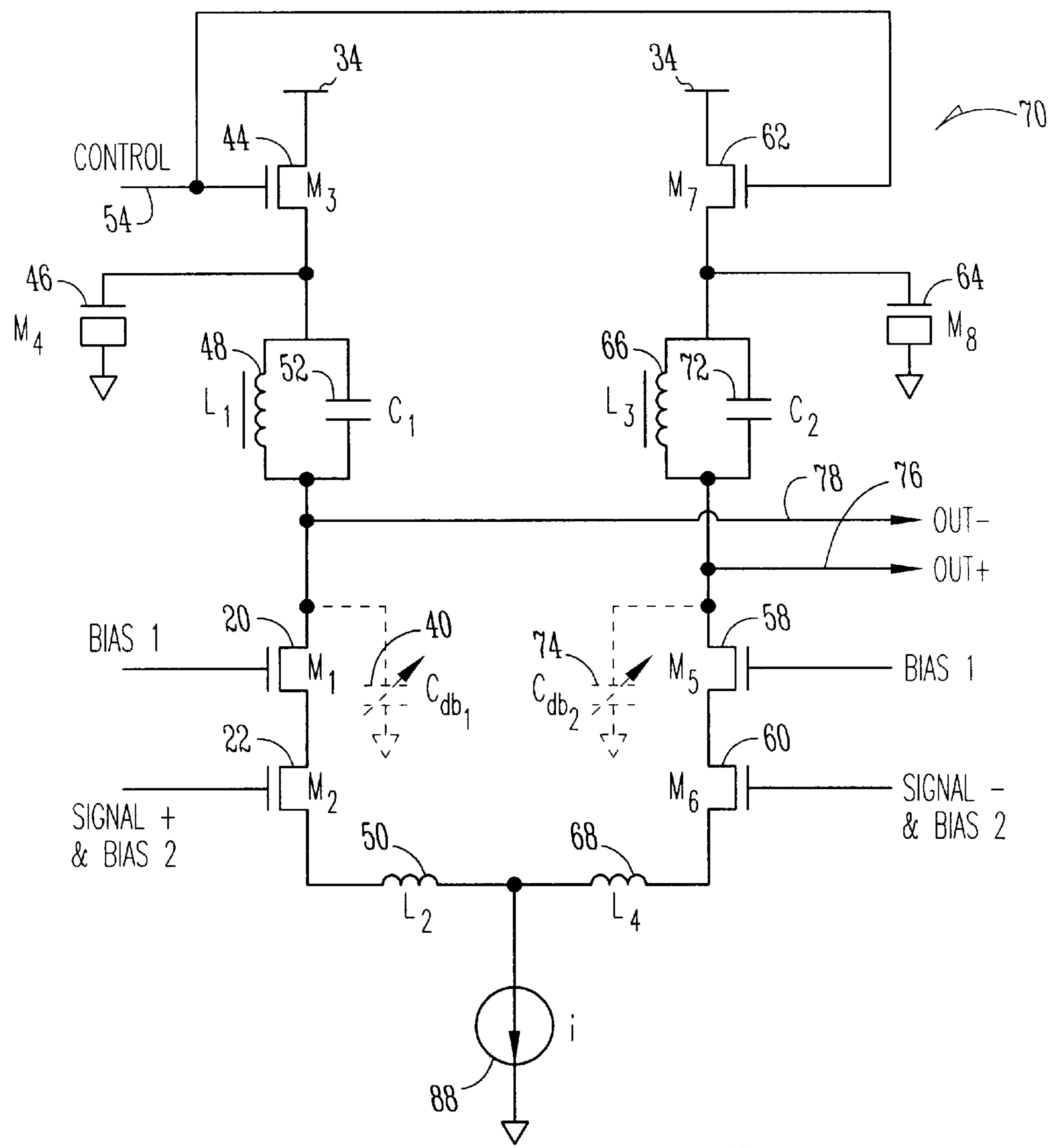
FIG. 3 is a schematic diagram illustrating a differential version of the LNA circuit of FIG. 2.

FIG. 3 is a schematic diagram illustrating a differential version 70 of the LNA circuit 42 of FIG. 2. As illustrated, the differential LNA circuit 70 of FIG. 3 includes a first circuit portion comprising: first, second, third and fourth transistors 20, 22, 44, 46 (M1, M2, M3, and M4, respectively); first and second inductors 48, 50 (L1 and L2, respectively); and a first capacitor 52 (C2) as in the single ended circuit. In addition, the differential LNA circuit 70 includes a second circuit portion comprising: fifth, sixth, seventh, and eighth transistors 58, 60, 62, 64 (M5, M6, M7, and M8, respectively); third and fourth inductors 66, 68 (L3 and L4, respectively); and a second capacitor 72 that are each counterparts to (and preferably matched to) corresponding elements in the first circuit portion. The differential LNA circuit 70 further includes a current source 88 coupled between a common terminal of the second and fourth inductors 50, 68 and ground. The first transistor 20 includes a first voltage variable diffusion capacitance 40 ($C_{db1}$) and the fifth transistor 58 includes a second voltage variable diffusion capacitance 74 ($C_{db2}$). A first bias voltage (BIAS 1) is applied to the gate terminals of the first and fifth transistors 20, 58 and a second bias voltage (BIAS 2) is applied to the gate terminals of the second and sixth transistors 22, 60. In addition, a first differential input signal (SIGNAL+) is applied to the gate terminal of the second transistor 22 and a second differential input signal (SIGNAL−) is applied to the gate terminal of the sixth transistor 60 during operation. First and second differential output lines 76, 78 (OUT+ and OUT−, respectively) are coupled to the drain terminals of the first and fifth transistors 20, 58. To tune the differential LNA circuit 70, a control signal is applied to a control terminal 54 that is coupled to the gate terminals of the third and seventh transistors 44, 62. Operation of the differential LNA circuit 70 is substantially the same as the single ended version of FIG. 2 described above.

In one aspect of the present invention, the tuning capabilities of the present invention are used to tune an amplifier to compensate for irregularities in the fabrication process. For example, manufacturing process variations will often result in slight variations in center frequency between production units. The electrical tuning capability afforded by the present invention can be used to tune these individual amplifiers as part of the manufacturing process to achieve a more consistent product. Alternatively, the present invention can allow manufacturing tolerances to be loosened, as any resulting frequency offsets can be easily tuned out.

Figure 4:
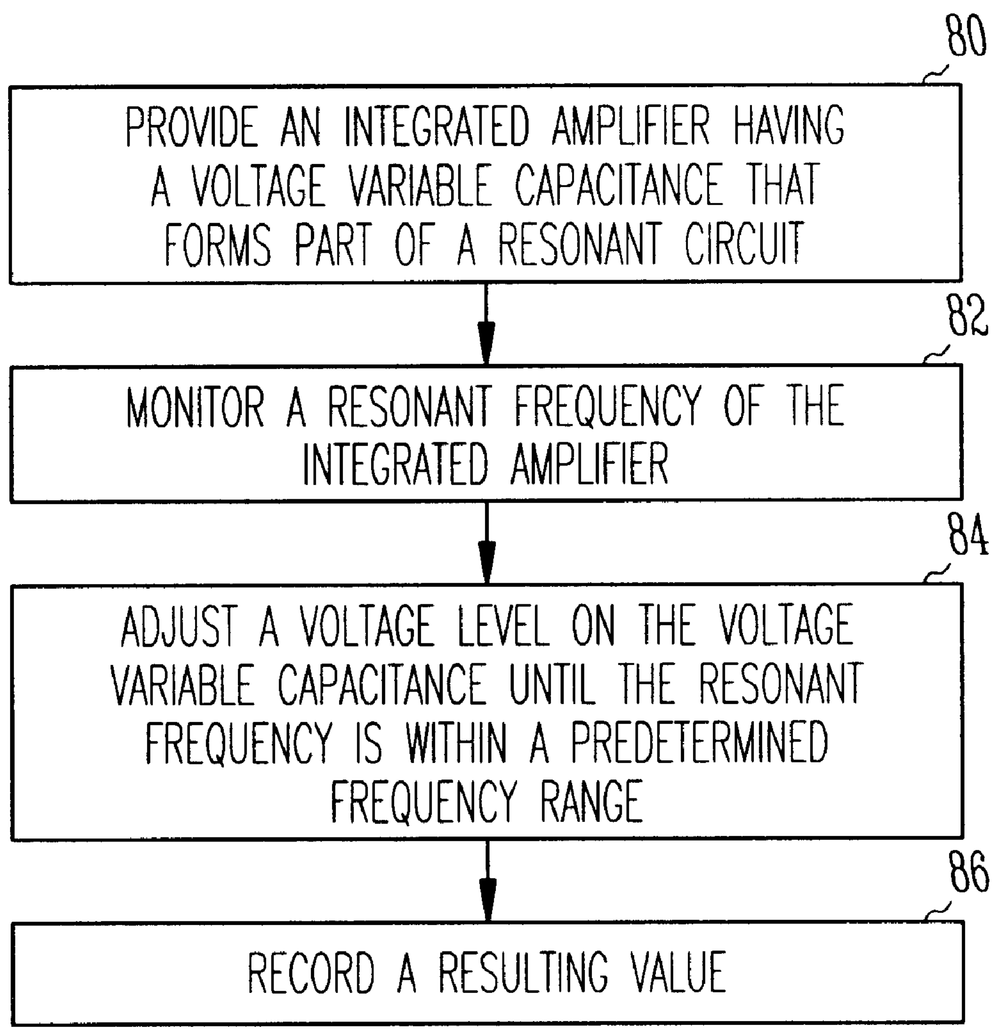
FIG. 4 is a flowchart illustrating a method for tuning an RF amplifier in accordance with one embodiment of the present invention.

FIG. 4 is a flowchart illustrating a method for tuning an integrated RF amplifier in accordance with the present invention. First, an RF amplifier is provided that has a voltage variable capacitance (e.g., a source diffusion capacitance within an IGFET) that forms part of a resonant circuit (block 80). A resonant frequency of the amplifier is measured and monitored (block 82). In one approach, the resonant frequency is monitored by applying an input signal having a relatively flat frequency spectrum (e.g., white noise) while observing an output spectrum of the amplifier. As will be apparent to persons of ordinary skill in the art, many alternative monitoring methods are also possible. While the resonant frequency is being monitored, the voltage level on the voltage variable capacitance is adjusted until the resonant frequency is within a predetermined range (block 84). For example, if the LNA amplifier 10 of FIG. 1 were being tuned using this method, the control signal being applied to the control input 38 of voltage adjustment unit 16 would be varied until a desired resonant frequency was detected by monitoring the output signal at signal output 26. A resulting value is then recorded for use during subsequent LNA operation (block 86). Preferably, the value that is recorded will be the actual control value applied to the voltage adjustment unit 16 that resulted in the desired resonant frequency. The above-described method is not limited to use in a manufacturing environment but can also be implemented in the field to periodically re-calibrate an RF amplifier. In one approach, an integrated control circuit is implemented to continuously monitor and control the LNA resonant frequency.

Figure 5:
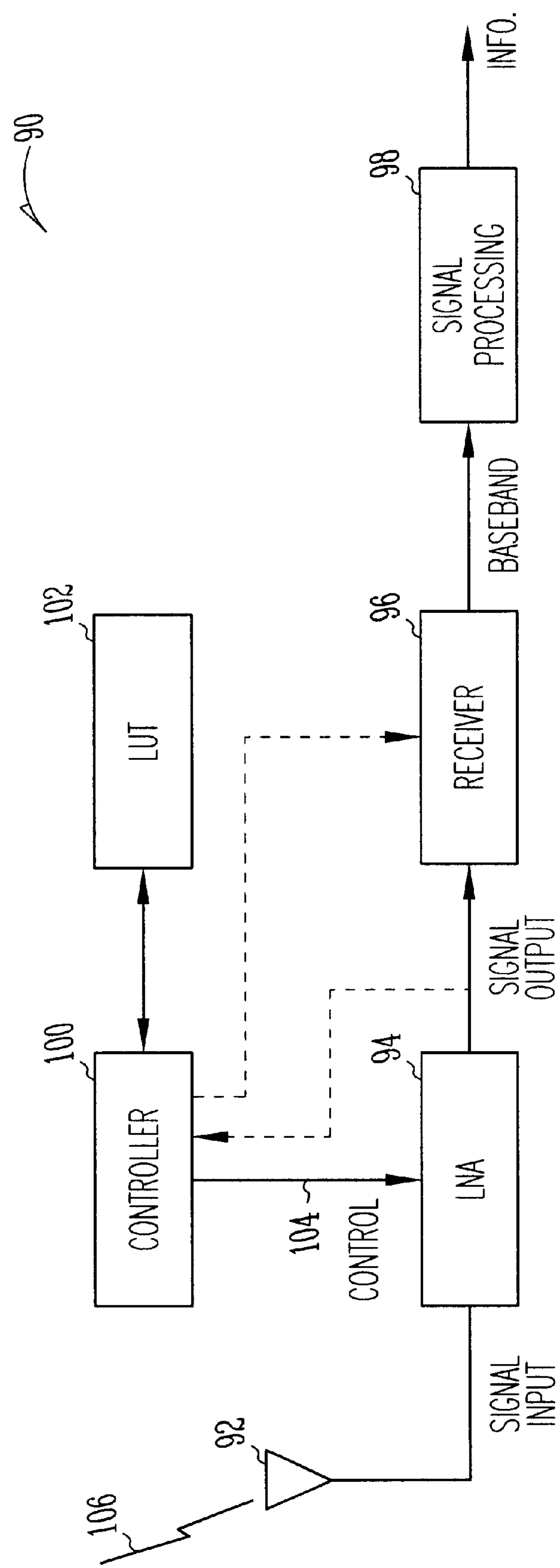
FIG. 5 is a block diagram illustrating a multi-band receiver arrangement in accordance with one embodiment of the present invention.

In another aspect of the present invention, the inventive principles are used to provide a multi-band tuned amplifier. The multi-band tuned amplifier can be used in a multi-band receiver to provide, for example, preselection functionality. As will be appreciated by persons of ordinary skill in the art, multi-band tuned amplifiers are also used in many other applications. FIG. 5 is a block diagram illustrating a multi-band receiver system 90 in accordance with one embodiment of the present invention. The receiver system 90 includes: a receive antenna 92, a multi-band LNA 94, a receiver 96, a signal processing unit 98, a controller 100, and a lookup table (LUT) 102. During operation, the receive antenna 92 receives an RF signal 106 from an exterior environment and transfers the signal to the input of the LNA 94. The LNA 94 amplifies the input signal and transfers the amplified output signal to the receiver 96. The receiver 96 down converts and decodes the amplified signal to generate a baseband signal at an output thereof. The baseband signal is then delivered to the signal processing unit 98 for additional processing to extract any useful information from the signal. The LNA 94 includes a resonant circuit having a voltage controllable capacitance as one of its components. The voltage controllable capacitance is preferably a diffusion capacitance associated with one of the transistors within the LNA 94, although other types of voltage controllable capacitance are also possible. The LNA 94 also includes a voltage adjustment circuit for varying a bias voltage applied to the voltage controllable capacitance in response to a control signal received from the controller 100 at control input 104 of the LNA 94. The controller 100 can thus adjust the operating frequency range of the LNA 94 by applying an appropriate control signal thereto. In one implementation, the LNA 94, the receiver 96, the controller 100, and the LUT 102 are all integrated on a common semiconductor chip.

The LUT 102 stores control values corresponding to a plurality of different operational frequency bands of the receiver system 90. These control values can each be determined using, for example, the method of FIG. 4, or a similar method. When the controller 100 determines that the present frequency band of the receiver system 90 needs to be changed, the controller 100 accesses the LUT 102 to retrieve a control value corresponding to the new frequency band. The controller 100 then delivers this control value to the control input 104 of the LNA 94. The voltage adjustment unit within the LNA 94 then changes the value of the voltage controllable capacitance therein to tune the LNA 94 to the desired band. The controller 100 may also deliver a control signal to the receiver 96 to cause the receiver 96 to be tuned to the new frequency band (e.g., to adjust the local oscillator frequency of a mixer within the receiver 96). In one approach, the controller 100 monitors the output signal from the LNA 94 to confirm that the LNA 94 is properly tuned. If the controller 100 determines that the LNA 94 is not properly tuned (e.g., the center frequency is slightly high or low), the controller 100 may modify the control signal being delivered to the LNA 94 to improve the tuning. The modified control signal may then be stored within the LUT 102 in place of the previous control value associated with that frequency band. In an alternative scheme, the LNA 94 does not include a voltage adjustment unit and the controller 100 applies a variable supply voltage to the LNA 94 to adjust the value of the voltage controllable capacitance.

In the amplifier embodiments described above, all transistors are IGFETs. It should be appreciated that the inventive principles can be implemented with other transistor types including: bipolar junction transistors (BJTs), junction field effect transistors (JFETs), and others, including combinations of different transistor types. In addition, the inventive principles can be implemented using amplifier configurations other than the cascode configuration described above. For example, an amplifier that replaces the two transistors of the cascode core 12 of FIG. 1 with a single transistor can be used. In fact, any amplifier configuration having a resonant circuit with a voltage variable capacitance as one of its elements can be used in accordance with the present invention. Furthermore, the inventive principles are not limited to use with low noise amplifier structures. It should be appreciated that some additional design of the device that will provide the variable tuning capacitance (e.g., first transistor 20 of FIG. 1) may be necessary to achieve the proper range of capacitance needed to perform the tuning procedure. Methods of achieving a desired parasitic capacitance range within a transistor are well known in the art.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A method for tuning an integrated RF amplifier circuit comprising:

receiving an input signal in an integrated RF amplifier including a resonant circuit having a plurality of circuit elements, said plurality of circuit elements including a voltage controllable diffusion capacitance associated with a fast transistor;

monitoring a resonant frequency of said integrated RF amplifier; and varying a voltage drop across a second transistor coupled between a supply node and said first transistor by varying a control signal on a control terminal of said second transistor to adjust a voltage level on said voltage controllable diffusion capacitance until said resonant frequency is within a predetermined frequency range.

2. The method claimed in claim 1, wherein:

said method is performed as part of a manufacturing test process.

3. The method claimed in claim 1, comprising:

recording, after adjusting said bias voltage level, a parameter value related to a resulting bias voltage level.

4. The method claimed in claim 3, comprising:

repeating adjusting and recording for another predetermined frequency range.

5. The method claimed in claim 4, comprising:

generating a table of parameter values corresponding to a plurality of different operational frequency bands for subsequent use in tuning said integrated RF amplifier.

6. A radio frequency (RF) amplifier comprising:

a first transistor having first and second output terminals, said first output terminal of said first transistor being coupled to an output node of said RF amplifier, said first transistor having a parasitic capacitance that varies with a bias voltage applied to said first output terminal of said first transistor, said first transistor being held in saturation during operation of said RF amplifier;

a resonant circuit coupled to said output node of said RF amplifier to provide a filter response on said output node, said parasitic capacitance of said first transistor affecting a center frequency of said filter response; and a tuning transistor having an input terminal and first and second output terminals, said input terminal of said tuning transistor to receive a control signal, said first output terminal of said tuning transistor being coupled to a supply node, and said second output terminal of said tuning transistor in communication with said first output terminal of said first transistor, said tuning transistor to vary a voltage drop between said supply node and said first output terminal of said first transistor in response to variations in said control signal during amplifier operation.

7. The RF amplifier claimed in claim 6, wherein:

said tuning transistor blocks power supply noise from said supply node during amplifier operation.

8. The RF amplifier claimed in claim 6, wherein:

said first transistor, said resonant circuit and said tuning transistor are integrated on a common semiconductor chip.

9. The RF amplifier claimed in claim 6, wherein said RF amplifier is a single ended amplifier.

10. The RF amplifier claimed in claim 6, wherein said RF amplifier is a differential amplifier.

11. The RF amplifier claimed in claim 6, comprising:

a controller to generate said control signal on said input terminal of said tuning transistor, said controller to generate said control signal in a manner that tunes an operational frequency range of said RF amplifier.

12. The RF amplifier claimed in claim 6, wherein:

said resonant circuit comprises an inductor and a capacitor coupled in parallel between said output node of said RF amplifier and said second output terminal of said tuning transistor.

13. An integrated RF amplifier circuit comprising:

a resonant circuit having a plurality of circuit elements including a voltage controllable diffusion capacitance associated with a first transistor, said resonant circuit having a resonant frequency; and a second transistor coupled between a supply node and said first transistor and comprising a control terminal coupled to receive a control signal to vary a voltage drop across said second transistor to adjust a voltage level on said voltage controllable diffusion capacitance until said resonant frequency is within a predetermined frequency range.

14. The RF amplifier circuit claimed in claim 13, wherein:

said first transistor, said resonant circuit, and said second transistor are integrated on a common semiconductor chip.

15. The RF amplifier circuit claimed in claim 13, wherein:

said resonant circuit further comprises an inductor and a capacitor coupled in parallel between said first transistor and said second transistor.

16. The RF amplifier circuit claimed in claim 13, further comprising:

an output node coupled to said first transistor.

17. The RF amplifier circuit claimed in claim 13, further comprising:

a controller coupled to said control terminal of said second transistor to generate said control signal to tune an operational frequency range of said RF amplifier circuit.

18. The RF amplifier circuit claimed in claim 13, wherein said RF amplifier circuit is a single ended amplifier circuit.

19. The RF amplifier circuit claimed in claim 13, wherein said RF amplifier circuit is a differential amplifier circuit.

20. A method of operating a radio frequency (RF) amplifier comprising:

varying a parasitic capacitance of a first transistor having an output terminal with a bias voltage applied to said output terminal, said output terminal of said first transistor being coupled to an output node of said RF amplifier, said first transistor being held in saturation during operation of said RF amplifier;

providing a filter response on said output node with a resonant circuit coupled to said output node of said RF amplifier, said parasitic capacitance of said first transistor affecting a center frequency of said filter response; and varying a voltage drop between a supply node and said output terminal of said first transistor in response to variations in a control signal during amplifier operation with a tuning transistor having an input terminal and first and second output terminals, said input terminal of said tuning transistor to receive said control signal, said first output terminal of said tuning transistor being coupled to said supply node, and said second output terminal of said tuning transistor in communication with said output terminal of said first transistor.

21. The method claimed in claim 20, further comprising:

blocking power supply noise from said supply node during amplifier operation with said tuning transistor.

22. The method claimed in claim 20, wherein:

said method is performed as part of a manufacturing test process.

23. The method claimed in claim 20, further comprising:

recording, after adjusting said bias voltage applied to said output terminal, a parameter value related to a resulting bias voltage applied to said output terminal.

24. The method claimed in claim 23, further comprising:

repeating adjusting and recording for another predetermined frequency range.

25. The method claimed in claim 20, further comprising:

generating a table of parameter values corresponding to a plurality of different operational frequency bands for subsequent use in tuning said RF amplifier.

* * * * *

UNITED STATES PATENT AND TRADEMARK OFFICE
CERTIFICATE OF CORRECTION

PATENT NO. : 6,653,904 B2
DATED : November 25, 2003
INVENTOR(S) : Franca-Neto

It is certified that error appears in the above-identified patent and that said Letters Patent is hereby corrected as shown below:

Column 7,
Line 33, delete “fast” and insert -- first -- , therefor.

Column 8,
Line 19, insert -- , -- after “circuit”.

Signed and Sealed this

Twenty-second Day of June, 2004

JON W. DUDAS
*Acting Director of the United States Patent and Trademark Office*